United States Patent
Yamamoto et al.

(10) Patent No.: US 8,854,820 B2
(45) Date of Patent: Oct. 7, 2014

(54) POWER MODULE

(75) Inventors: Shingo Yamamoto, Otsu (JP); Akio Sumiya, Kusatsu (JP); Yasuo Matsuda, Kusatsu (JP); Naoto Inoue, Kusatsu (JP); Makoto Tami, Shanghai (CN); Ryo Sugihara, Takeo (JP); Fumiaki Tanaka, Ogi (JP); Shintaro Hara, Takeo (JP); Shota Akinaga, Osaka (JP)

(73) Assignee: Omron Corporation, Kyoto (JP)

( * ) Notice: Subject to any disclaimer, the term of this patent is extended or adjusted under 35 U.S.C. 154(b) by 296 days.

(21) Appl. No.: 13/376,282

(22) PCT Filed: Jun. 22, 2010

(86) PCT No.: PCT/JP2010/004151
§ 371 (c)(1),
(2), (4) Date: Jan. 12, 2012

(87) PCT Pub. No.: WO2011/016175
PCT Pub. Date: Feb. 10, 2011

(65) Prior Publication Data
US 2012/0127668 A1    May 24, 2012

(30) Foreign Application Priority Data

Aug. 6, 2009   (JP) ................... 2009-183269

(51) Int. Cl.
*H05K 7/20* (2006.01)
*H01L 23/31* (2006.01)

(52) U.S. Cl.
CPC .......... *H01K 21/565* (2013.01); *H05K 7/20154* (2013.01); *H05K 7/20863* (2013.01); *H05K 7/20254* (2013.01); *H05K 7/20509* (2013.01); *H01L 23/3121* (2013.01); *H01L 2924/0002* (2013.01); *H05K 7/209* (2013.01); *H01L 2924/00* (2013.01); *H05K 7/20* (2013.01); *H05K 7/20854* (2013.01)
USPC ........... 361/715; 361/717; 361/718; 361/711; 361/704; 361/712; 361/713

(58) Field of Classification Search
CPC ..... H05K 7/20; H05K 7/209; H05K 7/20154; H05K 7/20254; H05K 7/20509; H05K 7/20854; H05K 7/20863; H01L 23/3121; H01L 21/565; H01L 2924/00; H01L 2924/0002
USPC .......... 361/715, 717, 718, 711, 704, 712, 713
See application file for complete search history.

(56) References Cited

U.S. PATENT DOCUMENTS 5,844,310 A  * 12/1998 Okikawa et al. ............... 257/712
5,869,890 A  *  2/1999 Nishiura et al. ............... 257/705

(Continued)

FOREIGN PATENT DOCUMENTS

| EP | 0774782 A2 * | 5/1997 | .............. H01L 23/12 |
| JP | 3-227042 A | 10/1991 | |

(Continued)

OTHER PUBLICATIONS

International Search Report issued in PCT/JP2010/004151, mailed on Jul. 27, 2010, with translation, 3 pages.

*Primary Examiner* — Anatoly Vortman
(74) *Attorney, Agent, or Firm* — Osha Liang LLP

(57) ABSTRACT

A power module can prevent damages due to cracking or breakage of an insulating substrate when molding even if a heat plate constituting a power module pre-product is made areally smaller than the insulating substrate, and can also sufficiently satisfy demand for minimization. Specifically, the power module pre-product is sealed by a molding resin layer in a state where externally exposed end portion on one end side in both external connecting terminals and the other surface side of a heat plate are each exposed to the outside. The power module substrate constituting a multilayer substrate body includes an aligning hole, into which an aligning pin is inserted, the pin being included in a lower molding die constituting a molding die with an upper molding die that molds a molding resin layer, so as to position the power module pre-product inside a cavity.

3 Claims, 7 Drawing Sheets

(56) References Cited

U.S. PATENT DOCUMENTS

| | | | |
|---|---|---|---|
| 5,920,119 A * | 7/1999 | Tamba et al. | 257/718 |
| 6,220,765 B1 * | 4/2001 | Tatoh | 385/94 |
| 6,345,917 B2 * | 2/2002 | Tatoh | 385/94 |
| 6,924,985 B2 * | 8/2005 | Kawakita et al. | 361/715 |
| 6,958,535 B2 * | 10/2005 | Hirano et al. | 257/707 |
| 7,403,395 B2 * | 7/2008 | Fujimoto et al. | 361/707 |
| 7,595,998 B2 * | 9/2009 | Tokunaga | 361/752 |
| 7,714,455 B2 * | 5/2010 | Son et al. | 257/787 |
| 2001/0001622 A1 * | 5/2001 | Tatoh | 385/94 |
| 2003/0011054 A1 * | 1/2003 | Jeun et al. | 257/678 |
| 2003/0168254 A1 * | 9/2003 | Kariya et al. | 174/261 |
| 2004/0089928 A1 * | 5/2004 | Nakajima et al. | 257/678 |
| 2006/0076671 A1 * | 4/2006 | Kariya et al. | 257/702 |
| 2007/0134976 A1 | 6/2007 | Fujimoto et al. | |
| 2007/0222046 A1 * | 9/2007 | Tokunaga | 257/678 |
| 2010/0055845 A1 * | 3/2010 | Ikawa et al. | 438/123 |
| 2011/0057327 A1 * | 3/2011 | Yoshida et al. | 257/777 |
| 2012/0187551 A1 * | 7/2012 | Kushino et al. | 257/659 |
| 2012/0202322 A1 * | 8/2012 | Takahashi | 438/121 |
| 2013/0270684 A1 * | 10/2013 | Negishi et al. | 257/675 |

FOREIGN PATENT DOCUMENTS

| | | | |
|---|---|---|---|
| JP | 10-116962 A | 5/1998 | |
| JP | 2007-165588 A | 6/2007 | |
| JP | 2009-059812 A | 3/2009 | |
| JP | 2009059812 A * | 3/2009 | H01L 23/28 |

* cited by examiner

POWER MODULE

BACKGROUND OF INVENTION

1. Technical Field

One or more embodiments of the present invention relate to a power module to be built particularly in high power products such as a solid state relay and a power supply.

2. Background Art

A power module of this kind is configured such that an insulating substrate made of ceramic or the like, a heat plate made of a metal plate, one surface side of which is joined to one surface of the insulating substrate, a power module substrate which is joined to the other surface of the insulating substrate and formed with a circuit pattern, a power semiconductor element disposed on the circuit pattern of the power module substrate, and an external connecting terminal electrically connected to the power semiconductor element via the circuit pattern are sealed by means of a molding resin layer in a state where one end portion of the external connecting terminal and the other surface of the heat plate are exposed to the outside.

Then, a conventional power module of this kind is configured having, for example as shown in FIG. 16, an insulating substrate "a" made of ceramic or the like, a heat plate b made of a metal plate, one surface side of which is joined to one surface of the insulating substrate "a", and a power module substrate c which is joined to the other surface of the insulating substrate "a" and formed with a circuit pattern (not shown).

A power semiconductor element d is disposed on the circuit pattern of the power module substrate c, while a pair of external connecting terminals e, f each exhibiting a curved shape so as to be electrically connected to the power semiconductor element d are set up on a surface of the power module substrate c.

Then, the insulating substrate "a", the heat plate b, the power module substrate c, the power semiconductor element d and the external connecting terminals e, f constitute a power module pre-product g.

The power module pre-product g is set inside a cavity j formed of an upper molding die h and a lower molding die i as resin molding dies, and then sealed by a molding resin layer formed by filling the inside of the cavity j with a molten resin in a state where externally exposed end portions e-1, f-1 on one end sides of the external connecting terminals e, f and the other surface side of the heat plate b are each exposed to the outside, so as to be configured as a power module serving as a product (see Patent Literature 1).

In the case of setting the power module pre-product g inside the cavity j so as to be sealed by the molding resin layer, the power module pre-product g has been positioned such that aligning holes e-2, f-2 provided in the externally exposed end portions e-1, f-1 are fitted respectively with aligning pins i-1, i-1 provided in the lower molding die i through use of the externally exposed end portions e-1, f-1 of the external connecting terminals e, f extending in a horizontal direction and being exposed to the outside from the molding resin layer in the figure.

However, the power module, as a product manufactured by sealing the power module pre-product g by the molding resin layer, is configured such that, when combined with the externally exposed end portions e-1, f-1 of the external connecting terminals e, f (each having the shape of a protrusion in a horizontal direction from the molding resin layer in the figure), the heat plate b made of a metal plate protrudes in the horizontal direction from the surface to protect the insulating substrate "a," which is vulnerable to a shock inside the cavity j so as to become areally large compared to the insulating substrate "a." Thus, an insulating distance between each of the externally exposed end portions e-1, f-1 and the heat plate b is short, and there is little choice but to enlarge the product size to ensure the insulating properties.

Therefore, the present applicant proposes a power module as described in Patent Literature 2.

That is, as shown in FIG. 17, such a power module is similar to above-mentioned Patent Literature 1 in that it is configured having a heat plate b made of a metal plate, one surface side of which is joined to one surface of an insulating substrate "a" made of ceramic or the like, and a power module substrate c which is joined to the other surface of the insulating substrate "a" and formed with a circuit pattern (not shown), and in that a power semiconductor element d is disposed on the circuit pattern of the power module substrate c while a pair of external connecting terminals e, f electrically connected to the power semiconductor element d are set up on the surface of the power module substrate c, to constitute a power module pre-product g, but the external connecting terminals e, f have been formed in linear shape, to be set up in a standing manner in an orthogonal direction to the surface of the power module substrate c, while the heat plate b has been made areally smaller than the insulating substrate "a". In addition, symbol m denotes a bonding body to electrically connect between one power module substrate c and the power semiconductor element d.

The power module having such a configuration can be provided as a product which sufficiently ensures the insulating distance between each of the external connecting terminals e, f and the heat plate b, and can also satisfy social demand for minimization of the size of the power module itself as a product.

Patent Literature 1: Japanese Unexamined Patent Publication No. 2007-165588

Patent Literature 2: Japanese Unexamined Patent Publication No. 2009-59812

However, in the power module shown in FIG. 17, when the power module pre-product g is to be set inside the cavity j and formed by the upper molding die h and the lower molding die i in order to seal the power module pre-product g by means of the molding resin layer. The protruding part of the insulating substrate "a" cannot be taken as an aligning region despite such a protrusion of the insulating substrate "a". This is, because the insulating substrate "a" is very vulnerable to a shock and may be damaged, for example, due to cracking or breakage by being brought into contact with the lower molding die i. Thus, the protruding part of the insulating substrate "a" cannot be used as an aligning means inside the cavity j of the power module pre-product g.

The conventional art thus has an issue providing a product in practical use, which is to be solved for satisfying demand for minimization of the power module pre-product g, and by extension, minimization of the power module itself by making the heat plate b areally small with respect to that of the insulating substrate "a".

SUMMARY OF INVENTION

Accordingly, one or more embodiments of the present invention enables provision of a product in practical use, which can prevent damages due to cracking or breakage of an insulating substrate at the time of molding even if a heat plate constituting a power module pre-product is made areally smaller than the insulating substrate, and can also sufficiently satisfy demand for minimization of a power module as a product.

A power module according to one or more embodiments of the present invention is provided with: a power module pre-product having a multilayer substrate body including a heat plate, one surface side of which is joined to one surface of an insulating substrate, and a power module substrate which is joined to the other surface of the insulating substrate and formed with a circuit pattern, a power semiconductor element disposed on the circuit pattern of the power module substrate, and a pair of external connecting terminals, arranged in a standing state in an orthogonal direction to a surface of the power module substrate, and electrically conducted to the power semiconductor element; and a molding resin layer which seals the power module pre-product in a state where externally exposed end portions on one end sides of the pair of the external connecting terminals and the other surface side of the heat plate are each exposed to the outside, and an aligning hole is formed in the multilayer substrate body.

According to one or more embodiments of the present invention, it is possible to provide a product in practical use, which can always set a power module pre-product in a regular position inside a cavity of a molding die in a short amount of time in the case of being set inside the cavity by insertion of the aligning hole provided in the multilayer substrate into the aligning pin on the molding die side even if the heat plate is formed into an areally small shape with respect to the insulating substrate, and can prevent damages due to cracking or breakage of the insulating substrate at the time of molding even if the heat plate constituting the power module pre-product is made areally smaller than the insulating substrate, while realizing minimization of the power module pre-product, and by extension, sufficiently satisfying demand for minimization of the power module itself as a product.

In one embodiment of the power module, a pair of aligning holes may be formed in the multilayer substrate body.

With such a configuration, even if the aligning hole is formed into the shape of a circular hole which is easy to process, the power module pre-product set inside the cavity is set in the regular position inside the cavity, and furthermore, it does not inadvertently move by rotation or the like after the setting.

Further, as another embodiment of the power module, the pair of aligning holes may be formed in mutually symmetrical positions with respect to a centroidal line of the power module pre-product.

With such a configuration, after the power module pre-product is set inside the cavity, it can always be kept in a stable set state inside the cavity without wobbling due to imbalance of a gravity distribution.

Further, as another embodiment of the power module, the aligning hole may be formed in the heat plate constituting the multilayer substrate body.

With such a configuration, by insertion of the aligning pin on the molding die side into the aligning hole formed in the heat plate, the power module pre-product set inside the cavity is set in the regular position inside the cavity, and furthermore, it does not inadvertently move by rotation or the like after the setting.

Further, as another embodiment of the power module, the aligning hole may be formed in the power module substrate constituting the multilayer substrate body.

With such a configuration, by insertion of the aligning pin on the molding die side into the aligning hole formed in the power module substrate, the power module pre-product set inside the cavity is set in the regular position inside the cavity, and furthermore, it does not inadvertently move by rotation or the like after the setting, and moreover, with the power module substrate being formable with a large thickness as compared with the heat plate, a large contact area of the aligning pin with the aligning hole can be ensured, so as to further stabilize positioning of the power module pre-product inside the cavity.

Further, as another embodiment of the power module, the aligning hole may be formed in a cylindrical body formed in a protruding manner on the surface of the power module substrate.

With such a configuration, by insertion of the aligning pin on the molding die side into the aligning hole formed in the power module substrate, the power module pre-product set inside the cavity is set in the regular position inside the cavity, and furthermore, it does not inadvertently move by rotation or the like after the setting, and moreover, the aligning hole configured of a cylindrical body is formed in a protruding manner on the power module substrate, and thus ultimately protrudes and is wrapped inside the molding resin layer which is formed with a relatively large thickness as compared with the other regions on the power module substrate, thereby not exerting any adverse effect on minimization of the power module pre-product, and by extension, minimization of the power module itself as a product and furthermore being formable with a relatively large length, whereby it is possible to ensure a large contact area of the aligning pin with the aligning hole, so as to further stabilize positioning of the power module pre-product inside the cavity.

Further, as another embodiment of the power module, the multilayer substrate body may further include an auxiliary resin substrate set up in a border portion between the externally exposed end portions in the pair of external connecting terminals and substrate connecting end portions therein which are sealed by the molding resin layer, and the aligning hole may be formed in the auxiliary resin substrate.

With such a configuration, by insertion of the aligning pin on the molding die side into the aligning hole formed in the auxiliary resin substrate, the power module pre-product set inside the cavity is set in the regular position inside the cavity, and furthermore, it does not inadvertently move by rotation or the like after the setting, and moreover, the auxiliary resin substrate is located on the power module substrate and wrapped by a portion of the molding resin layer, which is formed with a relatively large thickness, thereby not exerting any adverse effect on minimization of the power module pre-product, and by extension, minimization of the power module itself as a product and furthermore the aligning hole can be formed with a relatively large length, whereby it is possible to ensure a large contact area of the aligning pin with the aligning hole, so as to further stabilize positioning of the power module pre-product inside the cavity.

Further, as another embodiment of the power module, the molding resin layer may have a closed-end hole formed by the aligning pin inserted into the aligning hole, and an undercut portion may be formed on an inner wall surface of the closed-end hole.

With such a configuration, for example, at the time of moving the upper molding die with respect to the lower molding die in order to demold the power module as a completed product after sealing of the power module pre-product by means of the molding resin layer inside the cavity, the power module as the product is hooked on the undercut portion of the closed-end hole, and can thus be reliably held inside the lower molding die. From the above respects, an eject mechanism for demolding may be set up only on the lower molding die side, thereby eliminating the need for separate setup of the mechanism in the upper molding die side, to allow reduction in production cost of the molding die itself.

Further, as another embodiment of the power module, the undercut portion may be concave with respect to the inner wall surface.

Further, as another embodiment of the power module, it may be inwardly convex with respect to the inner wall surface.

Further, as another embodiment of the power module, the undercut portion may have the shape of a triangle thread.

Further, as another embodiment of the power module, the insulating substrate may be a ceramic plate.

Further, as another embodiment of the power module, the heat plate may be a metal plate.

Further, as another embodiment of the power module, the pair of external connecting terminals may have a linear shape.

In one or more embodiments of the present invention configured as thus described, it is possible to provide a product in practical use, which can always set a power module pre-product in a regular position inside a cavity of a molding die in the case of being set inside the cavity by insertion of the aligning hole provided in the insulating substrate into the aligning pin on the molding die side, and can prevent damages due to cracking or breakage of the insulating substrate at the time of molding even if the heat plate constituting the power module pre-product is made areally smaller than the insulating substrate, while realizing minimization of the power module pre-product, and by extension, sufficiently satisfying demand for minimization of the power module itself as a product.

DETAILED DESCRIPTION

In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention. One or more embodiments of the present invention is to provide a power module capable of making a heat plate smaller than an insulating substrate to achieve minimization of a power module pre-product, and by extension, minimization of the power module itself as a product, while preventing damages due to cracking or breakage of the insulating substrate at the time of molding a molding resin layer.

EXAMPLE 1

Next, Example 1 according to one or more embodiments of the present invention will be described with reference to FIGS. 1 to 4.

Figure 1:
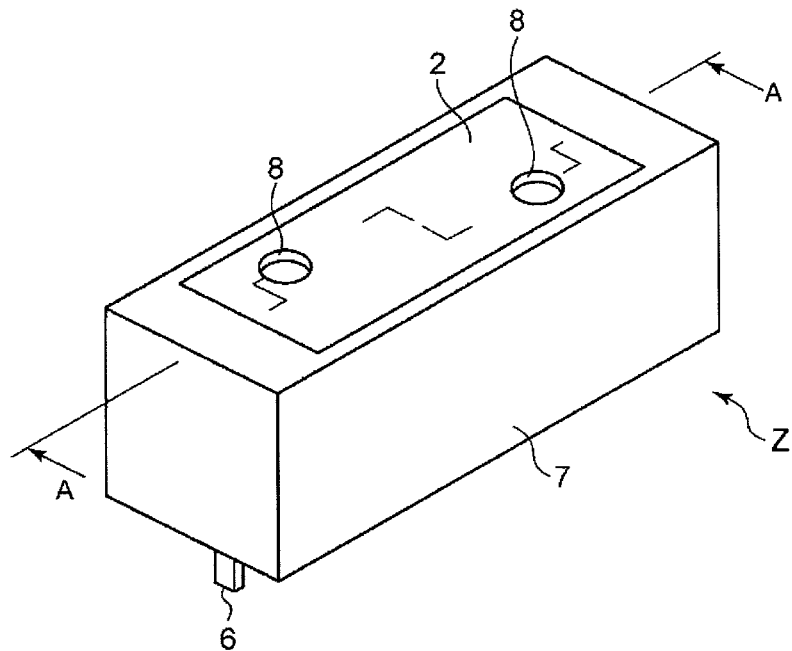
FIG. 1 is a perspective view of a power module according to one or more embodiments of the present invention.
Figure 2:
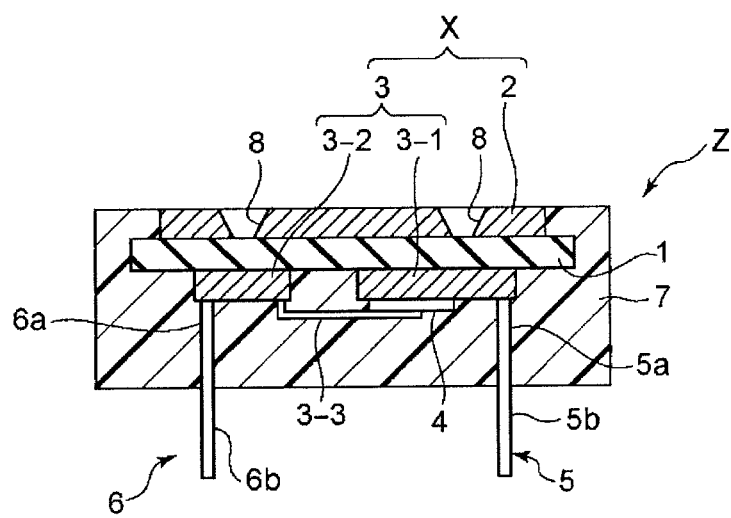
FIG. 2 is a sectional view along A-A of FIG. 1.

As clearly shown in FIG. 2, a power module Z according to Example 1 of one or more embodiments of the present invention has an insulating substrate 1 made of ceramic or the like, a heat plate 2 made of a metal plate, one surface side of which is joined to one surface of the insulating substrate 1, and a power module substrate 3 which is joined to the other surface of the insulating substrate 1 and formed with a circuit pattern, and the heat plate 2 and the power module substrate 3 constitute a multilayer substrate body X.

Then, the power module substrate 3 is configured with a first substrate portion 3-1 and a second substrate portion 3-2 which are electrically cut from each other, and a power semiconductor element 4 is disposed on a circuit pattern (not shown) formed in the first substrate portion 3-1, while the power semiconductor element 4 is electrically connected with a circuit pattern (not shown) formed in the second substrate portion 3-2 via a bonding body 3-3.

Further, substrate connecting end portions 5a, 6a as one end portion sides of external connecting terminals 5, 6 which are respectively formed in linear shape are set up in a standing manner on respective surfaces of the first substrate portion 3-1 and the second substrate portion 3-2.

Figure 4:
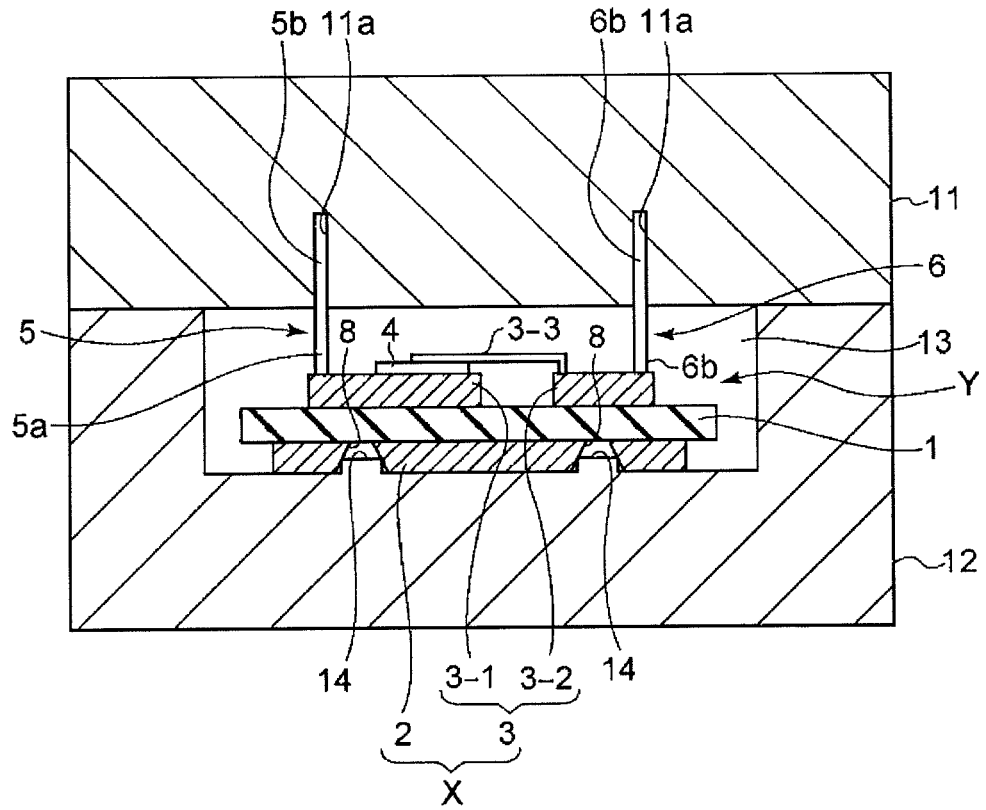
FIG. 4 is a longitudinal sectional view of a power module pre-product according to one or more embodiments of the present invention shown in FIG. 1 is set inside a cavity of a molding die.

Hence, the one external connecting terminal 5, the circuit pattern in the first substrate portion 3-1, the power semiconductor element 4, the bonding body 3-3, the second substrate portion 3-2, and the other external connecting terminal 6 are electrically connected, to constitute a power module pre-product Y (see FIG. 4).

The power module pre-product Y is sealed by a molding resin layer 7 in a state where externally exposed end portions 5b, 6b on the other end sides of the external connecting terminals 5, 6 and the other surface side of the heat plate 2 are each exposed to the outside, to constitute the power module Z as a product.

Figure 3:
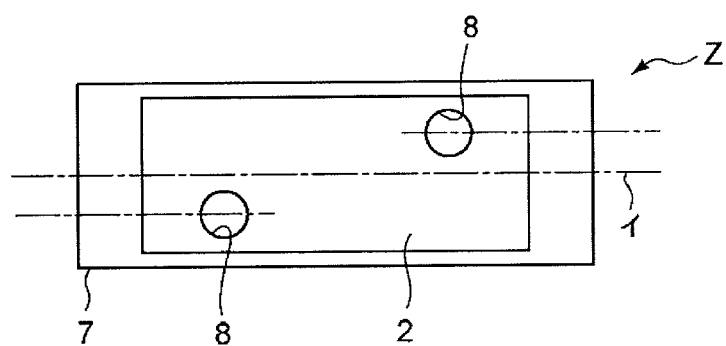
FIG. 3 is a top-down view of a power module shown in FIG. 1.

Such a power module Z exhibits a rectangular shape in plan view as shown in FIG. 3, and makes the externally exposed end portions 5b, 6b of the external connecting terminals 5, 6, which are formed in linear shape, exposed to the outside from the opposite-side surface to the heat plate 2 in the molding resin layer 7, while forming the heat plate 2 to be areally small with respect to the insulating substrate 1, so as to sufficiently ensure the insulating distance between each of the external connecting terminals 5, 6 and the heat plate 2, and at the same time to satisfy social demand for minimization of the product size.

Moreover, on the other surface side of the heat plate 2, a pair of aligning holes 8, 8 in the shape of a circular hole are formed so as to be present in mutual symmetrical positions with respect to a centroidal line A in a longer-side direction (or a centroidal line in a shorter-side direction) of the power module pre-product Y shown in FIG. 3. The aligning holes 8, 8 are formed to be taper holes each having a smaller diameter on the insulating substrate 1 side.

As shown in FIG. 4, in the state of the power module pre-product Y being set inside a cavity 13 formed with an upper molding die 11 and a lower molding die 12 closing a mold, the inside of the cavity 13 is filled with a molten resin, thereby to provide the molding resin layer 7.

At the time of providing the molding resin layer 7 in the power module pre-product Y, the power module pre-product Y turns the heat plate 2 to the lower molding die 12 side inside the cavity 13, and at this time, the aligning holes 8, 8 are fitted with aligning pins 14 formed in a protruding manner integrally with or separately from the lower molding die 12 so that the power module pre-product Y is set in a predetermined position inside the cavity 13. In such a state, the externally exposed end portions 5b, 6b of the external connecting terminals 5, 6 are fitted into clearance holes 11a provided in the upper molding die 11.

From such a state, the inside of the cavity 13 is filled with the molten resin, to form the molding resin layer 7. Subsequently, the upper molding die 11 is moved upward with respect to the lower molding die 12 to open the mold, and the power module Z shown in FIG. 1, having been left in the lower molding die 12 and completed as a product, is taken out.

Hence, in the Example 1 according to one or more embodiments of the present invention, it is possible to always set the power module pre-product Y in a regular position inside the cavity 13, formed by the upper molding die 11 and the lower molding die 12, in a short amount of time at the time of molding the molding resin layer 7 in the case of setting the power module pre-product Y inside the cavity 13 by insertion of the aligning pins 14 provided on the lower molding die 12 side into the aligning holes 8, 8 provided in the heat plate 2 constituting the multilayer substrate body X so as to, for example, prevent the insulating substrate 1 from making contact with the lower molding die 12 and thus from being damaged due to cracking or breakage of the insulating substrate 1 at the time of molding of the molding resin layer 7 even if the heat plate 2 is made areally smaller than the insulating substrate 1, and it is also possible to achieve practical use of minimization, and by extension, provide a product in practical use with the power module itself having been minimized.

Further, since the aligning holes 8, 8 are integrally formed in the heat plate 2, even if they are formed into the shape of a circular hole which is easy to process, the power module pre-product Y set inside the cavity 13 can be reliably set in a regular position, and furthermore, it does not inadvertently move by rotation or the like after the setting.

Moreover, the pair of aligning holes 8, 8 are arranged and formed in mutual symmetrical positions with respect to the centroidal line of the power module pre-product, and hence, after the power module pre-product Y is set inside the cavity, it can always be kept in a stable set state without wobbling due to imbalance of a gravity distribution.

EXAMPLE 2

Figure 5:
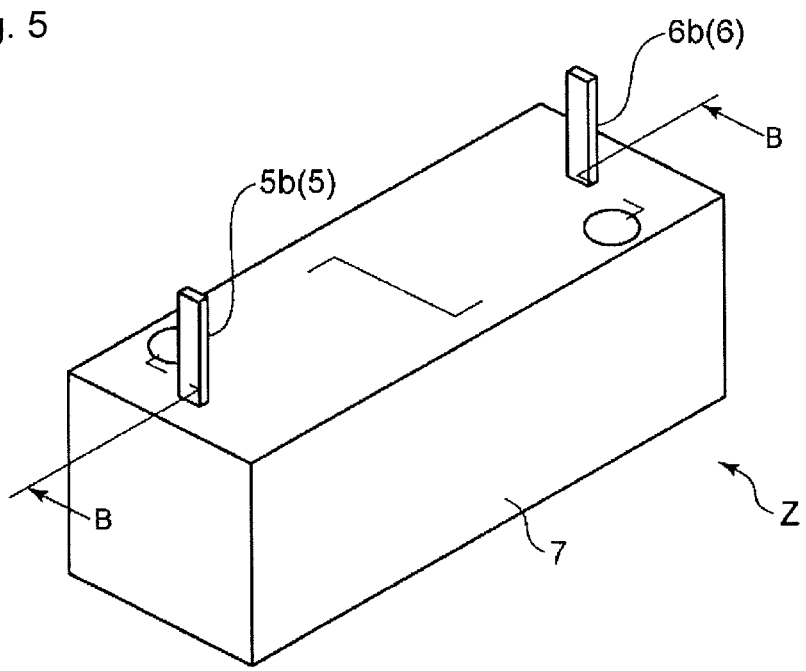
FIG. 5 is a perspective view of a power module according to one or more embodiments of the present invention.

Next, Example 2 according to one or more embodiments of the present invention will be described with reference to FIGS. 5 to 7.

Figure 6:
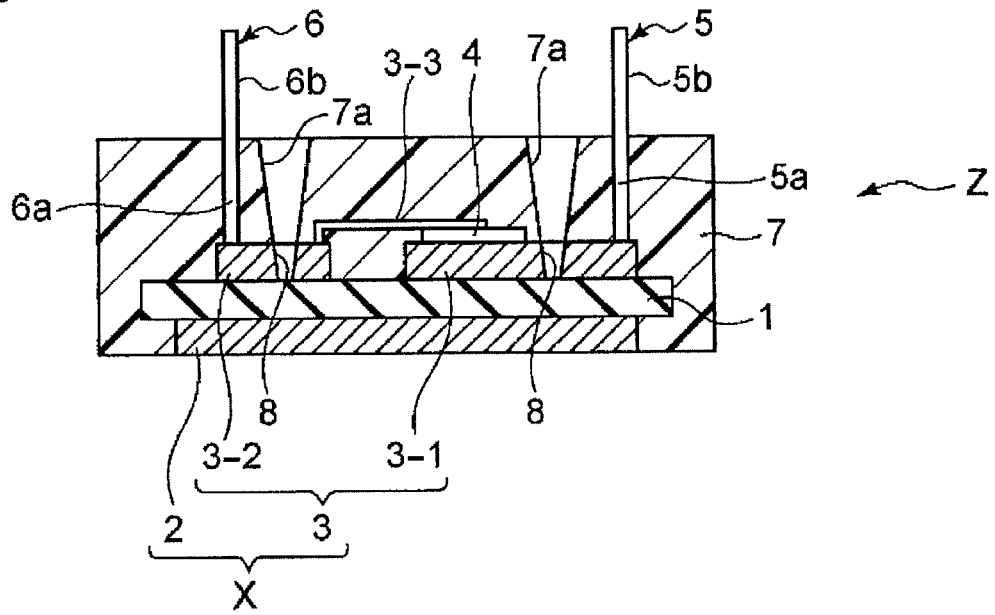
FIG. 6 is a sectional view along B-B of FIG. 4.

As clearly shown in FIG. 6, similarly to Example 1, a power module Z according to Example 2 of one or more embodiments of the present invention is configured having an insulating substrate 1 made of ceramic or the like, a heat plate 2 made of a metal plate, one surface side of which is joined to one surface of the insulating substrate 1, and a power module substrate 3 which is joined to the other surface of the insulating substrate 1 and formed with a circuit pattern, and the heat plate 2 and the power module substrate 3 constitute a multilayer substrate body X.

Then, the power module substrate 3 is configured with a first substrate portion 3-1 and a second substrate portion 3-2 which are electrically cut from each other, and a power semiconductor element 4 is disposed on a circuit pattern (not shown) formed in the first substrate portion 3-1, while the power semiconductor element 4 is electrically connected with a circuit pattern (not shown) formed in the second substrate portion via a bonding body 3-3.

Further, substrate connecting end portions 5a, 6a as one end portion sides of external connecting terminals 5, 6 which are respectively formed in linear shape are set up in a standing manner on respective surfaces of the first substrate portion 3-1 and the second substrate portion 3-2.

Hence, the one external connecting terminal 5, the circuit pattern in the first substrate portion 3-1, the power semiconductor element 4, the bonding body 3-3, the second substrate portion 3-2, and the other external connecting terminal 6 are electrically connected, to constitute a power module pre-product Y.

Aligning holes 8, 8 to be fitted with aligning pins of a molding die, not shown, are respectively formed in the first substrate portion 3-1 and the second substrate portion 3-2 of the power module substrate 3, and the power module pre-product Y is thereby positioned in the state of being set inside a cavity of the molding die by insertion of the aligning pins on the molding die side into the aligning holes 8, 8, and then sealed by a molding resin layer 7 in a state where externally exposed end portions 5b, 6b on the other sides of the external connecting terminals 5, 6 and the other surface side of the heat plate 2 are each exposed to the outside, so as to constitute the power module Z as a product.

Figure 7:
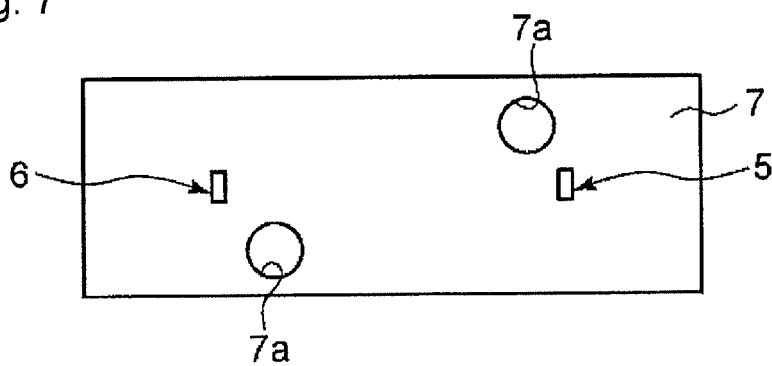
FIG. 7 is a top-down of a power module shown in FIG. 4.

Such a power module Z as a product exhibits a rectangular shape in plan view as shown in FIG. 7, and forms the external connecting terminals 5, 6 in linear shape, to make the externally exposed end portions 5b, 6b exposed to the outside from the opposite-side surface to the heat plate 2 in the molding resin layer 7, while forming the heat plate 2 to be areally small with respect to the insulating substrate 1, so as to sufficiently ensure the insulating distance between each of the external connecting terminals 5, 6 and the heat plate 2, and at the same time to satisfy social demand for minimization of the product size.

The aligning holes 8, 8 respectively formed in the first substrate portion 3-1 and the second substrate portion 3-2 of the power module substrate 3 are formed so as to be present in mutual symmetrical positions with respect to a centroidal line in a longer-side direction (or a centroidal line in a shorter-side direction) of the power module pre-product Y, as in the Example 1.

Although not shown, as in Example 1, in the state of the power module pre-product Y being set inside the cavity formed by an upper molding die and a lower molding die closing a mold, the inside of the cavity is filled with a molten resin, to provide the molding resin layer 7.

At the time of providing the molding resin layer 7 in the power module pre-product Y, for example when the aligning pins are formed on the lower molding die side, the power module pre-product Y turns the externally exposed end portions 5b, 6b of the external connecting terminals 5, 6 to the lower molding die side, and at this time, the aligning holes 8, 8 are fitted with aligning pins (not shown) formed in a protruding manner integrally with or separately from the lower molding die so that the power module pre-product Y is set in a predetermined position inside the cavity.

The molding resin layer 7 is molded in the state of such aligning pins being fitted with the aligning holes 8, 8, thereby to form through holes 7a each communicated to the aligning hole 8 made by means of the aligning pin. The aligning holes 8, 8 and the through holes 7a continuously linked thereto are formed to be taper holes each having a smaller diameter on the insulating substrate 1 side.

In Example 2 according to one or more embodiments of the present invention as thus configured, it is possible to always set the power module pre-product Y in a regular position inside the cavity 13 in a short amount of time at the time of molding the molding resin layer 7 in the case of being set inside the cavity by insertion of the aligning pins on the molding die side into the aligning holes 8, 8 provided in the power module substrate 3, so as to prevent the insulating substrate 1 from making contact with the molding die and thus from being damaged due to cracking or breakage of the insulating substrate 1 at the time of molding the molding resin layer 7 even if the heat plate 2 is made areally smaller than the insulating substrate 1, and it is also possible to achieve practical use of minimization, and by extension, provide a product in practical use with the power module Z itself as a product having been minimized.

Further, since the aligning holes 8, 8 are formed in pair in the first substrate portion 3-1 and the second substrate portion 3-2 of the power module substrate 3 which are respectively joined and fixed to the insulating substrate 1, even if they are formed into the shape of a circular hole which is easy to process, the power module pre-product Y set inside the cavity can be reliably set in a regular position, and furthermore, it does not inadvertently move by rotation or the like after the setting.

Moreover, the pair of aligning holes 8, 8 are arranged and formed in mutual symmetrical positions with respect to the centroidal line of the power module pre-product Y, and hence, after the power module pre-product Y is set inside the cavity, it can always be kept in a stable set state without wobbling due to imbalance of a gravity distribution.

Furthermore, in the case of setting the power module pre-product Y inside the cavity of the molding dies, the aligning holes 8, 8 are made to be fitted with the aligning pins disposed on the lower of the molding dies out, thereby allowing an operator to perform a setting operation for the power module pre-product Y while viewing a fitting operation between the aligning holes 8, 8 and the aligning pins, so that the certainty of the setting and significant reduction in setting time is achieved.

Figure 8:
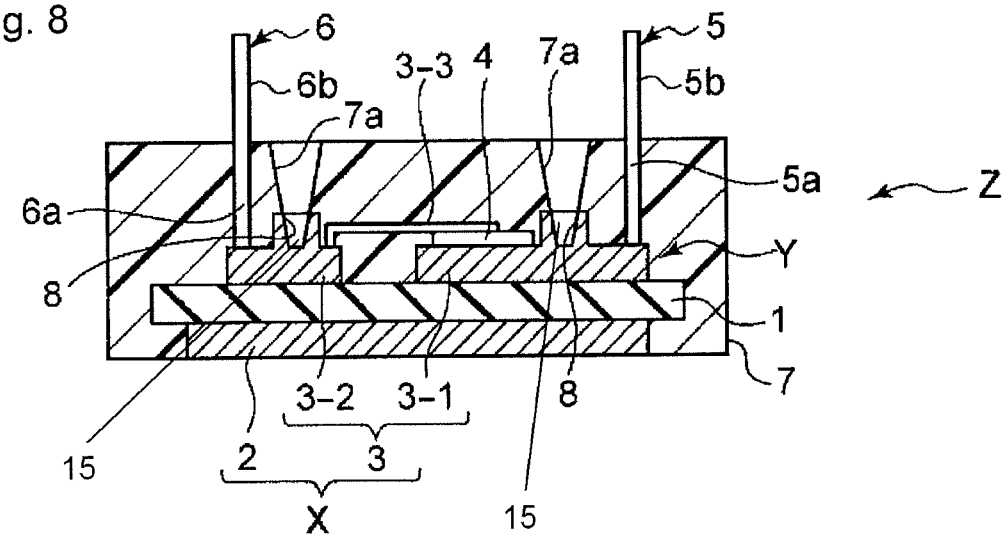
FIG. 8 is a sectional view of a power module according to one or more embodiments of the present invention and is similar to FIG. 6.

FIG. 8 shows a modified example of above Example 2.

According to such a modified example shown in FIG. 8, there has been adopted a different configuration from above Example 2 in that the aligning holes 8, 8 are formed in the cylindrical bodies 15 that are formed in a protruding manner on the surface of the power module substrate 3.

According to such a configuration, even if the aligning holes 8, 8 are formed in the cylindrical bodies 15 that are formed in a protruding manner on the power module substrate 3, they ultimately protrude and are completely wrapped inside the molding resin layer 7 because the molding resin layer 7 is formed with a relatively large thickness as compared with the other regions on the power module substrate 3, and hence the aligning holes 8, 8 do not exert any adverse effect on minimization of the power module pre-product Y, and by extension, minimization of the power module Z itself as a product and can furthermore be formed with a relatively large length, whereby it is possible to ensure a large contact area of the aligning pin with the aligning hole, so as to further stabilize positioning of the power module pre-product Y inside the cavity.

EXAMPLE 3

Next, Example 3 according to one or more embodiments of the present invention will be described with reference to FIGS. 9 and 10.

Figure 9:
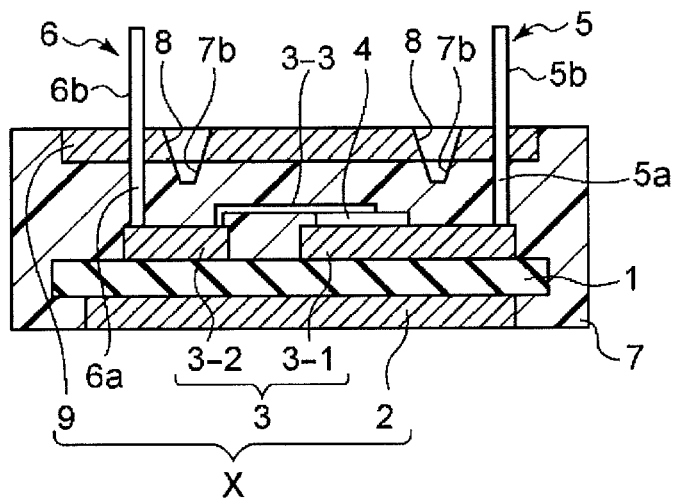
FIG. 9 is a sectional view of a power module according to one or more embodiments of the present invention and is similar to FIG. 6.

As clearly shown in FIG. 9, similarly to the above examples, a power module Z according to Example 3 of one or more embodiments of the present invention has an insulating substrate 1 made of ceramic or the like, a heat plate 2 made of a metal plate, one surface side of which is joined to one surface of the insulating substrate 1, and a power module substrate 3 which is joined to the other surface of the insulating substrate 1 and formed with a circuit pattern, and the heat plate 2 and the power module substrate 3 constitute a multilayer substrate body X.

Then, the power module substrate 3 is configured of a first substrate portion 3-1 and a second substrate portion 3-2 which are electrically cut from each other, and a power semiconductor element 4 is disposed on a circuit pattern (not shown) formed in the first substrate portion 3-1, while the power semiconductor element 4 is electrically connected with a circuit pattern (not shown) formed in the second substrate portion 3-2 via a bonding body 3-3.

Further, substrate connecting end portions 5a, 6a as one end portion sides of external connecting terminals 5, 6 which are respectively formed in linear shape are set up in a standing manner on respective surfaces of the first substrate portion 3-1 and the second substrate portion 3-2.

Figure 10:
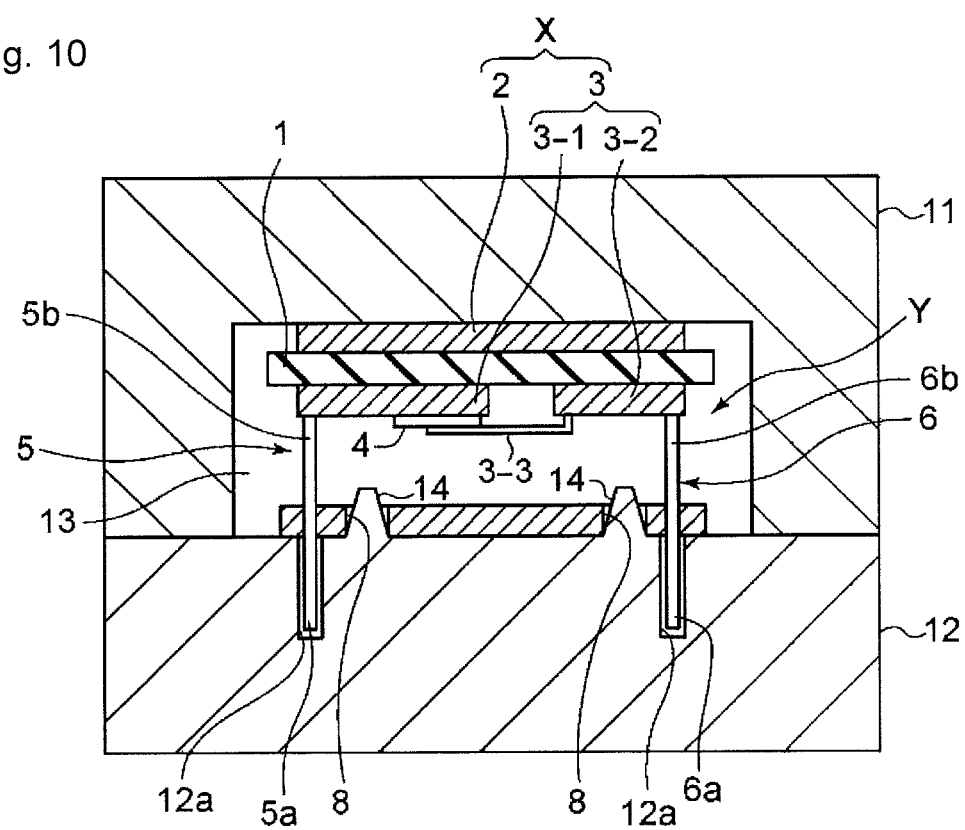
FIG. 10 is a longitudinal sectional view of a power module where a power module pre-product according to one or more embodiments of the present invention shown in FIG. 9 is set inside a cavity of a molding die.

Hence, the one external connecting terminal 5, the circuit pattern in the first substrate portion 3-1, the power semiconductor element 4, the bonding body 3-3, the second substrate portion 3-2, and the other external connecting terminal 6 are electrically connected, to constitute a power module pre-product Y (see FIG. 10).

Present Example 3 is characterized in that an auxiliary resin substrate 9, which also constitutes the multilayer substrate body X and exhibits a rectangular shape in plan view, is set up in a border portion between the substrate connecting end portions 5a, 6a in the external connecting terminals 5, 6, and externally exposed end portions 5b, 6b therein, and the aligning holes 8, 8 are formed in the auxiliary resin substrate 9.

Further, the aligning holes 8, 8 are arranged in mutual symmetrical positions with respect to a centroidal line in a longer-side direction (or a centroidal line in a shorter-side direction) of the power module pre-product Y in the auxiliary resin substrate 9, while the aligning holes 8, 8 are formed to be taper holes each having a smaller diameter on the power module substrate 3 side.

The power module pre-product Y is sealed by a molding resin layer 7 in a state where externally exposed end portions 5b, 6b on the other end sides of the external connecting terminals 5, 6 and the other surface side of the heat plate 2 are each exposed to the outside, to constitute the power module Z as a product.

Such a power module Z forms the external connecting terminals 5, 6 in linear shape, to make the externally exposed end portions 5b, 6b exposed to the outside from the opposite-side surface to the heat plate 2 in the molding resin layer 7, while forming the heat plate 2 to be areally small with respect to the insulating substrate 1, so as to sufficiently ensure the insulating distance between each of the external connecting terminals 5, 6 and the heat plate 2, while providing a product in practical use with a minimized product size.

As shown in FIG. 10, in the state of the power module pre-product Y being set inside a cavity 13 formed with an upper molding die 11 and a lower molding die 12 closing a mold, the inside of the cavity 13 is filled with a molten resin, thereby to provide the molding resin layer 7.

At the time of providing the molding resin layer 7 in the power module pre-product Y, the power module pre-product Y turns the heat plate 2 to the lower molding die 12 side inside the cavity 13, and at this time, the aligning holes 8, 8 are fitted with aligning pins 14 formed in a protruding manner integrally with the lower molding die 12 so that the power module pre-product Y is set in a predetermined position inside the cavity 13. At this time, the aligning pins 14 pass through the aligning holes 8, 8 and protrude inside the cavity 13.

Moreover, as shown in FIG. 10, the externally exposed end portions 5b, 6b of the external connecting terminals 5, 6 are fitted, with spaces, into clearance holes 12a provided in the lower molding die 12. Even with such spaces formed, the molding resin layer 7 does not cover the externally exposed end portions 5b, 6b sides of the external connecting terminals 5, 6 due to the auxiliary resin substrate 9 blocking the clearance holes 12a, and in the molding resin layer 7, tapered closed-end holes 7b continuously provided to the aligning holes 8, 8 are formed by means of the aligning pins protruding on the cavity 13 side from the aligning holes 8, 8.

From such a state, the inside of the cavity 13 is filled with the molten resin, to form the molding resin layer 7. Subsequently, the upper molding die 11 is moved upward with respect to the lower molding die 12 to open the mold, and the power module Z shown in FIG. 9, having been left in the lower molding die 12 and completed as a product, is taken out.

Therefore, in Example 3 according to one or more embodiments of the present invention, it is possible to always set the power module pre-product Y in a regular position inside the cavity 13, formed by the upper molding die 11 and the lower molding die 12, in a short amount of time at the time of molding the molding resin layer 7 in the case of setting the power module pre-product Y inside the cavity 13 by insertion of the aligning pins 14 provided on the molding die 12 side into the aligning holes 8, 8 provided in the auxiliary resin substrate 9 constituting the multilayer substrate body X so as to, for example, prevent the insulating substrate 1 from making contact with the lower molding die 12 and thus from being damaged due to cracking or breakage of the insulating substrate 1 at the time of molding of the molding resin layer 7 even if the heat plate 2 is made areally smaller than the insulating substrate 1, and it is also possible to achieve practical use of minimization, and by extension, provide a product in practical use with the power module itself as a product having been minimized.

Further, since the aligning holes 8, 8 are integrally formed in the auxiliary resin substrate 9, even if they are formed into the shape of a circular hole which is easy to process, the power module pre-product Y set inside the cavity 13 can be reliably set in a regular position, and furthermore, it does not inadvertently move by rotation or the like after the setting.

Moreover, the pair of aligning holes 8, 8 are arranged and formed in mutual symmetrical positions with respect to the centroidal line of the power module pre-product Y, and hence, after the power module pre-product Y is set inside the cavity 13, it can always be kept in a stable set state in the cavity 13 without wobbling due to imbalance of a gravity distribution.

Furthermore, in the case of setting the power module pre-product Y inside the cavity 13, the aligning holes 8, 8 are made to be fitted with the aligning pins 14, 14 provided on the lower molding die 12 side, thereby allowing the operator to perform a setting operation for the power module pre-product Y while viewing a fitting operation between the aligning holes 8, 8 and the aligning pins 14, 14, so that the certainty of the set positions and significant reduction in setting time can be expected.

Next, a modified example of above Example 3 will be described with reference to FIGS. 11 to 15.

Figure 11:
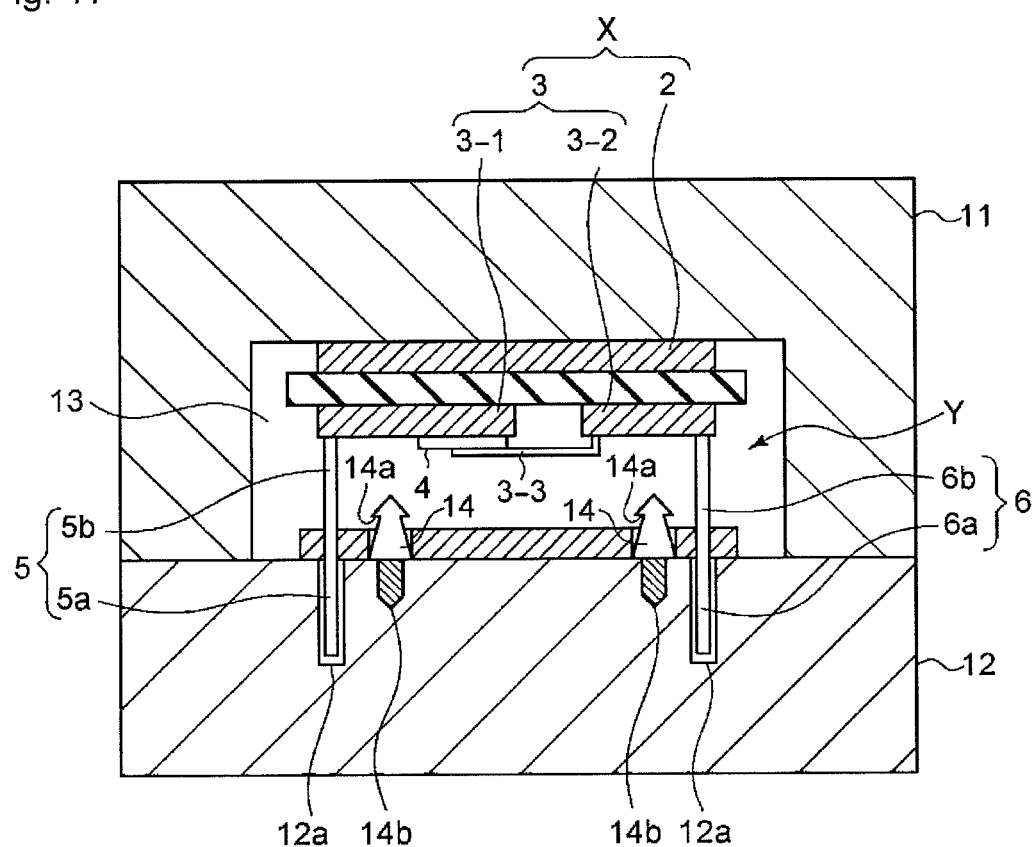
FIG. 11 is a longitudinal sectional view of a power module pre-product in accordance with one or more embodiments of the present invention is set inside the cavity of the molding die.

First, a first modified example in above Example 3 will be described with reference to FIGS. 11 and 12.

This first modified example is characterized in that the aligning pin 14 is provided at its midway portion with a constricted portion which tapers down toward the power module substrate 3 side, thereby to be provided with a protrusion 14a having a substantially triangle shape in cross section, while the aligning pin 14 is integrally formed with a threaded shaft 14b in its one end portion, so as to be detachably set up in the lower molding die 12.

Figure 12:
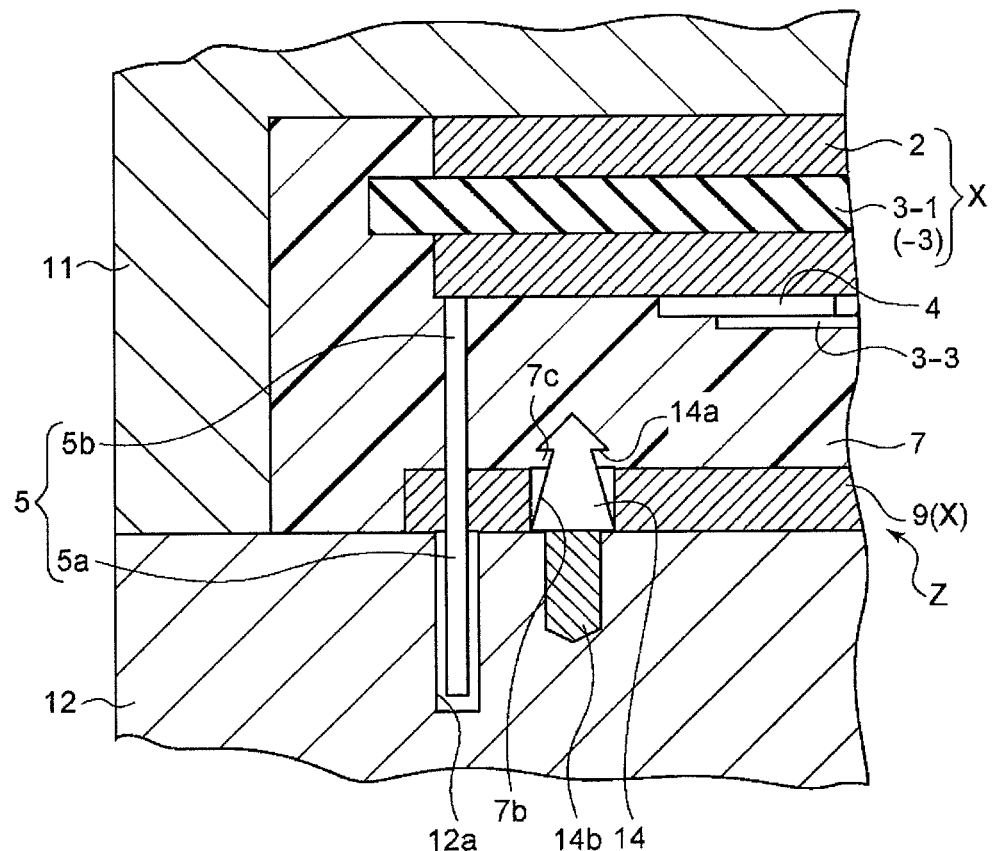
FIG. 12 is a main-part sectional view illustrating when the inside of the cavity of the molding die, set with the power module pre-product shown in FIG. 11, is filled with a molten resin to mold a molding resin layer.

With such a configuration, as shown in FIG. 12, the molding resin layer 7 enters and is formed even inside a space formed between the aligning hole 8 in the auxiliary resin substrate 9 and the aligning pin, while the closed-end hole 7b made by the aligning pin 14 is formed, and a convex undercut portion 7c made by the protrusion 14a is formed on the inner wall surface of the closed-end hole 7b.

As a result of such a configuration, in order to demold the power module Z as a completed product after sealing of the power module pre-product Y by means of the molding resin layer 7 inside the cavity 13, for example, at the time of moving the upper molding die 11 with respect to the lower molding die 12, the undercut portion 7c of the closed-end hole 7b is hooked on the protrusion 14a of the aligning pin 14, and the power module Z as a product can thus be reliably held inside the lower molding die 12, to be prevented from sticking to the upper molding die 11. From such a respect, an eject mechanism (not shown) for demolding may be set up only on the lower molding die 12 side, thereby eliminating the need for separate setup on the upper molding die 11, to allow reduction in production cost of the molding die itself.

Figure 13:
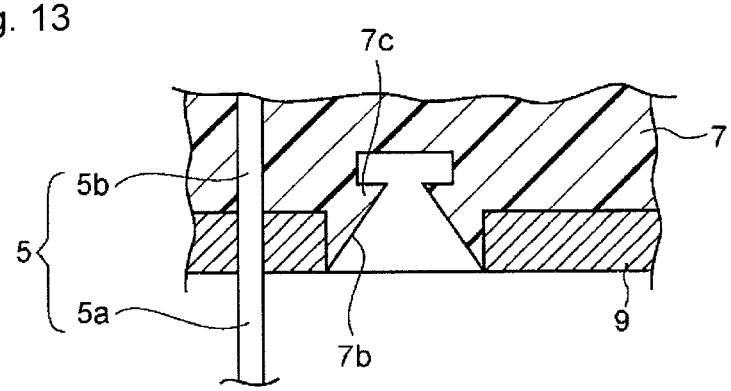
FIG. 13 is a longitudinal sectional view of a power module according to one or more embodiments of the present invention.
Figure 14:
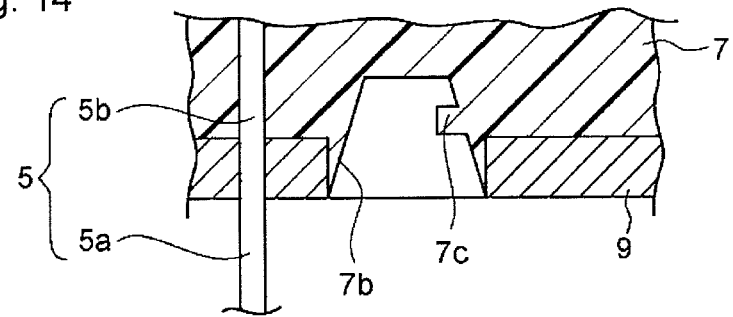
FIG. 14 is a longitudinal sectional view of a power module according to one or more embodiments of the present invention.
Figure 15:
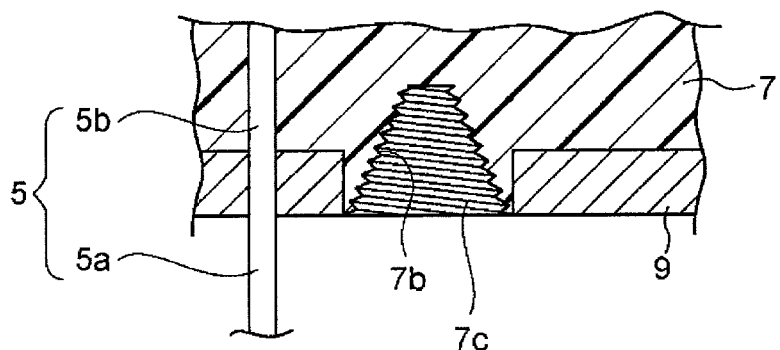
FIG. 15 is a longitudinal sectional view of power module according to one or more embodiments of the present invention.
Figure 16:
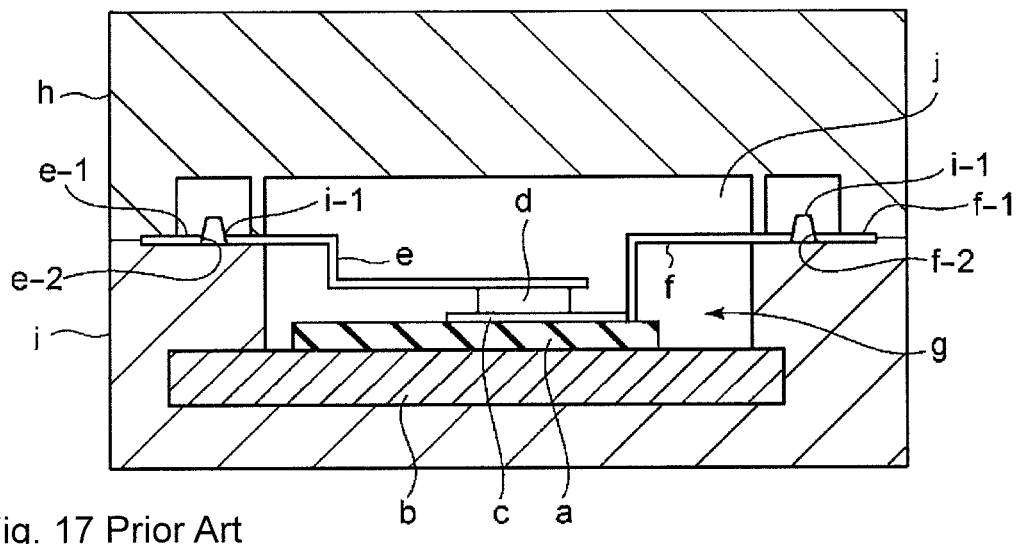
FIG. 16 is a longitudinal sectional view of a power module pre-product constituting a power module according to one conventional art is set inside a cavity of molding dies.
Figure 17:
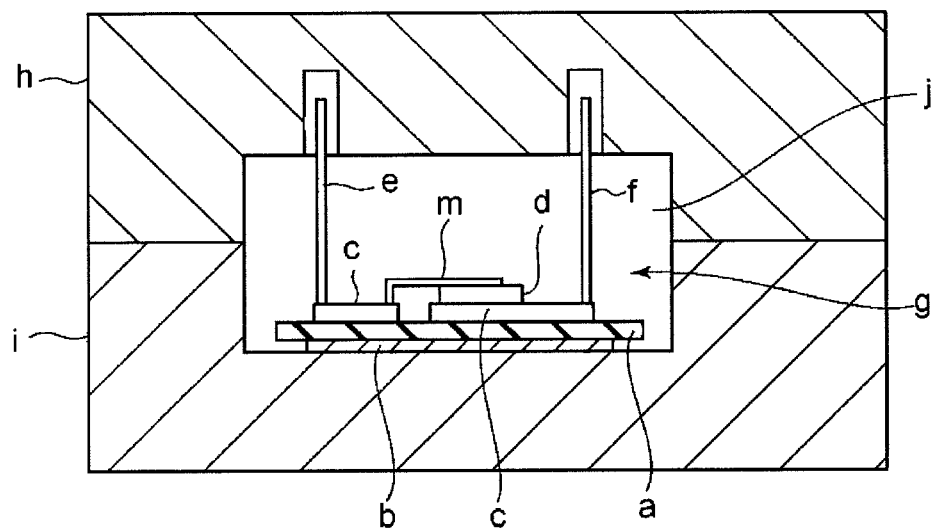
FIG. 17 is a longitudinal sectional view of a power module pre-product constituting a power module according to another conventional art is set inside a cavity of molding dies.

A second modified example of Example 3 shown in FIG. 13 is one in which, by change in shape of the aligning pin 14, the closed-end hole 7b formed in the molding resin layer 7 exhibits a tapered shape with its diameter decreasing toward the power module substrate 3 side, and its bottom-side end portion is then formed into a concave portion having a rectangular shape in cross section, to form the convex undercut portion 7c on the inner wall surface. A third modified example of Example 3 shown in FIG. 14 is one in which, again by change in shape of the aligning pin 14, the closed-end hole 7b formed in the molding resin layer 7 has the shape of an inner wall surface exhibiting a tapered shape with its diameter decreasing toward the power module substrate 3 side, while the inwardly convex undercut portion 7c is formed on the inner wall surface. Further, a fourth modified example of Example 3 shown in FIG. 15 is one in which, again by change in shape of the aligning pin 14, the closed-end hole 7b formed in the molding resin layer 7 has the shape of an inner wall surface exhibiting a tapered shape with its diameter decreasing toward the power module substrate side, while the convex undercut portion 7c exhibiting the shape of a triangle thread is formed on the inner wall surface. Any of the undercut portions 7c in the second to fourth modified examples exerts a similar function effect to that of the undercut portion 7c in the first modified example.

Further, in each modified example in Example 3, the aligning pin 14 provided in the lower molding die 12 is provided with the threaded shaft 14b, to be configured detachably from the lower molding die 12, whereby in the case of occurrence of abrasion or the like, a part can be replaced by a new part, thereby eliminating the need for replacement of the lower molding die 12 itself, to allow reduction in production cost of the molding die.

It is to be noted that, although the aligning holes 8 have been formed in pair in any of the above examples, because they have been provided for the purpose of serving as an aligning means at the time of setting the power module pre-product Y inside the cavity 13, and also for the purpose of preventing inadvertent movement after the setting, the aligning holes 8 are not restricted to being in pair, but three or more thereof may be provided, and further, the aligning hole 8 may be formed into polygonal shape, thereby being provided alone in a position including the centroid of the power module pre-product Y.

As described above, one or more embodiments of the present invention enables provision of a product in practical use, which can always set a power module pre-product in a regular position inside a cavity of a molding die by insertion of an aligning pin on the molding die side into an aligning hole, and can prevent damages due to cracking or breakage of an insulating substrate at the time of molding even if a heat plate is made areally smaller than the insulating substrate, while realizing minimization, and by extension, sufficiently satisfying demand for minimization of the power module itself as a product, and hence one or more embodiments of the present invention is suitable for a power module to be built particularly in high power products such as a solid state relay and a power supply.

DESCRIPTION OF SYMBOLS 1 insulating substrate
2 heat plate
3 power module substrate
4 power semiconductor element
5, 6 external connecting terminal
5a, 6a substrate connecting end portion
5b, 6b externally exposed end portion
7 molding resin layer
7b closed-end hole
7c undercut portion
8 aligning hole
9 auxiliary resin substrate
11 upper molding die
12 lower molding die
13 cavity
14 aligning pin
Y multilayer substrate body
X power module pre-product
Z power module as product
A centroidal line While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims

The invention claimed is:

1. A power module, comprising:
    a power module pre-product having a multilayer substrate body comprising:
        a heat plate, one surface side of which is joined to one surface of an insulating substrate;
        a power module substrate which is joined to the other surface of the insulating substrate and formed with a circuit pattern;
        a power semiconductor element disposed on the circuit pattern of the power module substrate; and
        a pair of external connecting terminals, arranged in a standing state in an orthogonal direction to a surface of the power module substrate, and electrically connected to the power semiconductor element; and
    a molding resin layer which seals the power module pre-product in a state where externally exposed end portions on one end sides of the pair of the external connecting terminals and the other surface side of the heat plate are each exposed to the outside,
    wherein an aligning hole is formed in a cylindrical body formed in a protruding manner on the surface of the power module substrate constituting the multilayer substrate body.

2. The power module according to claim 1, wherein the aligning hole is a pair of aligning holes.

3. The power module according to claim 2, wherein the aligning holes of the pair of aligning holes are formed in mutually symmetrical positions with respect to a centroidal line of the power module pre-product.

* * * * *